US009640937B2

(12) United States Patent
Krause et al.

(10) Patent No.: US 9,640,937 B2
(45) Date of Patent: May 2, 2017

(54) LASER ARRANGEMENT

(71) Applicant: Laserline Gesellschaft fur Entwicklung und Vertrieb von Diodenlasern mbH, Mulheim-Karlich (DE)

(72) Inventors: Volker Krause, Lonning (DE); Georg Rehmann, Koblenz (DE); Charley Bachert, Koblenz (DE)

( * ) Notice: Subject to any disclaimer, the term of this patent is extended or adjusted under 35 U.S.C. 154(b) by 0 days.

(21) Appl. No.: 14/777,951

(22) PCT Filed: Mar. 21, 2014

(86) PCT No.: PCT/DE2014/100099
§ 371 (c)(1),
(2) Date: Sep. 17, 2015

(87) PCT Pub. No.: WO2014/146650
PCT Pub. Date: Sep. 25, 2014

(65) Prior Publication Data
US 2016/0285226 A1    Sep. 29, 2016

(30) Foreign Application Priority Data
Mar. 21, 2013   (DE) ........................ 10 2013 102 880

(51) Int. Cl.
H01S 3/067    (2006.01)
H01S 3/094    (2006.01)
H01S 5/40     (2006.01)
H01S 3/0941   (2006.01)
H01S 3/04     (2006.01)

(52) U.S. Cl.
CPC .......... *H01S 3/06754* (2013.01); *H01S 3/067* (2013.01); *H01S 3/094007* (2013.01); *H01S 5/405* (2013.01); *H01S 3/0407* (2013.01); *H01S 3/06704* (2013.01); *H01S 3/09415* (2013.01); *H01S 3/094015* (2013.01); *H01S 5/4012* (2013.01)

(58) Field of Classification Search
CPC . H01S 3/06754; H01S 5/405; H01S 3/094007
See application file for complete search history.

(56) References Cited

U.S. PATENT DOCUMENTS 7,369,582 B2    5/2008   Kumkar et al.
9,444,226 B2    9/2016   Krause et al.
2005/0220429 A1  10/2005  Davis
(Continued)

FOREIGN PATENT DOCUMENTS

DE  102011016253   10/2012
JP  2002-501436 A   1/2002
JP  2009-524232 A   6/2009
(Continued)

*Primary Examiner* — Jerry Rahll
(74) *Attorney, Agent, or Firm* — Welsh Flaxman & Gitler LLC

(57) ABSTRACT

The invention relates to a laser assembly with a converter designed as a fiber laser for generating a converted output laser beam, and having a pumping source that supplies a pump beam to the converter and includes a plurality of laser diodes that generate the pump beam and are formed by emitters mounted on laser bars, the pumping source including beam forming optics for forming the laser beams supplied by the emitters into the pump beam.

12 Claims, 9 Drawing Sheets

(56) References Cited

U.S. PATENT DOCUMENTS

2012/0268808 A1  10/2012  Clowes et al.
2013/0028276 A1   1/2013  Minelly et al.

FOREIGN PATENT DOCUMENTS

| | | |
|---|---|---|
| JP | 2010-026027 A | 2/2010 |
| WO | WO9853949 | 12/1998 |
| WO | WO2005122345 | 12/2005 |
| WO | WO2010007938 | 1/2010 |

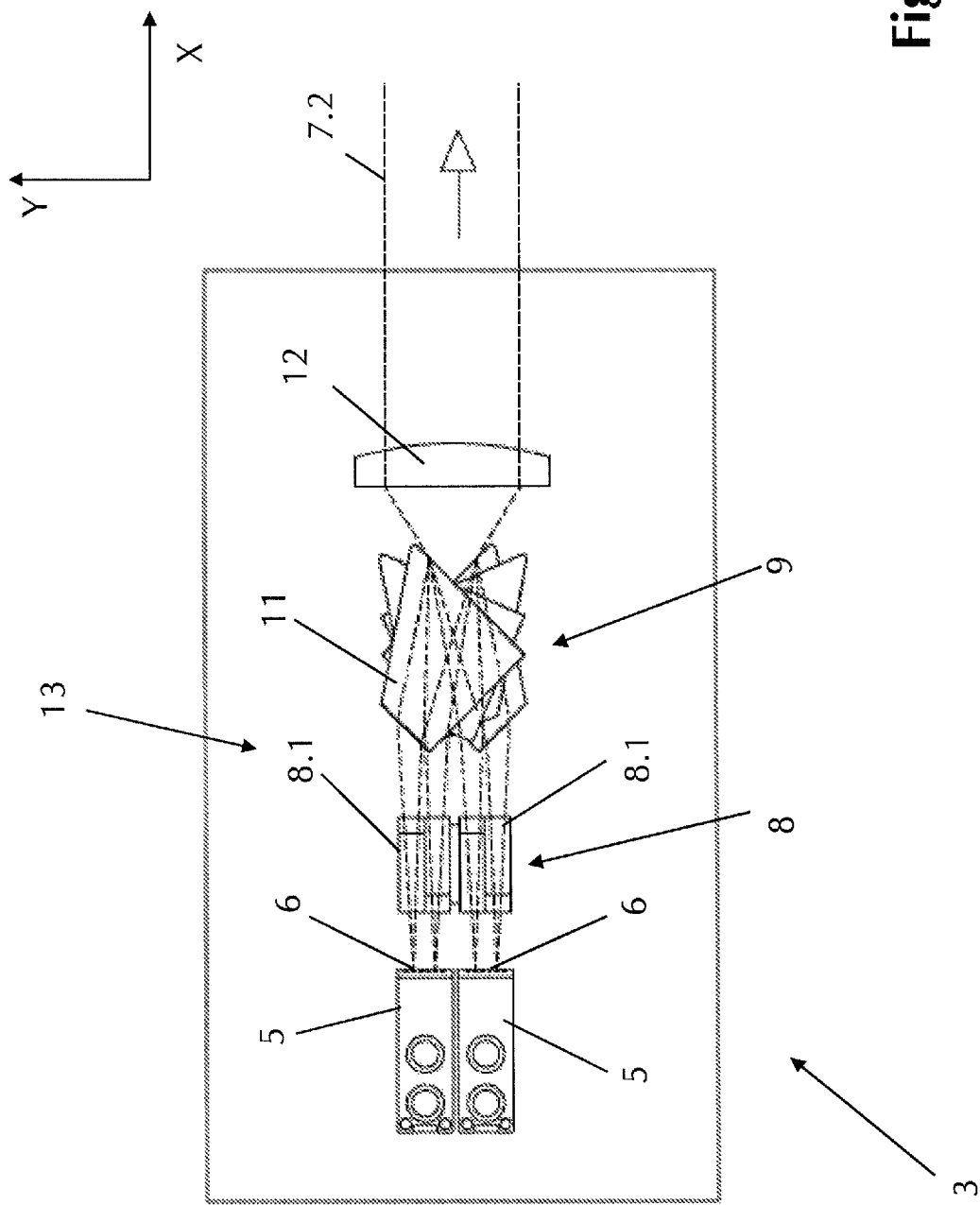

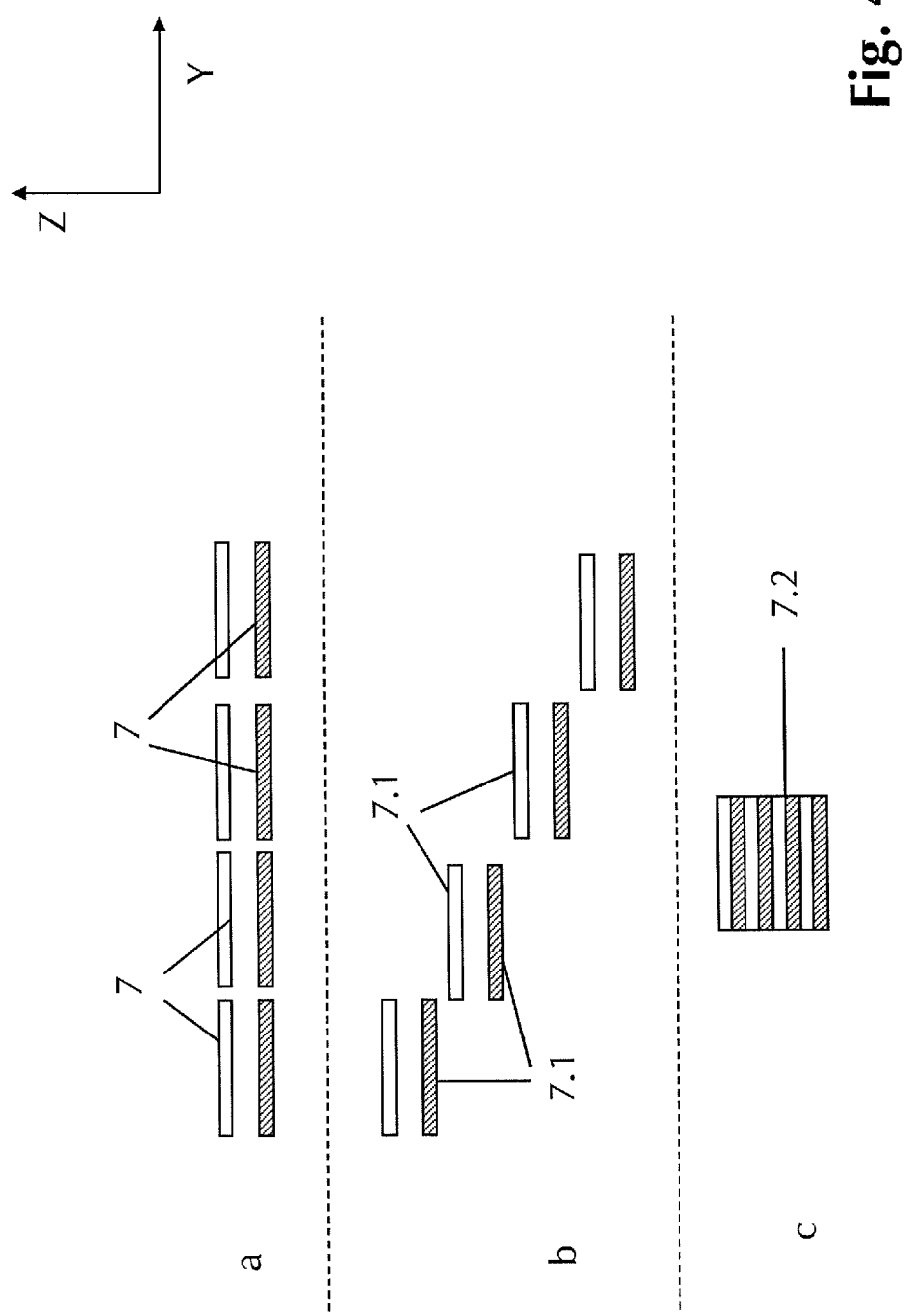

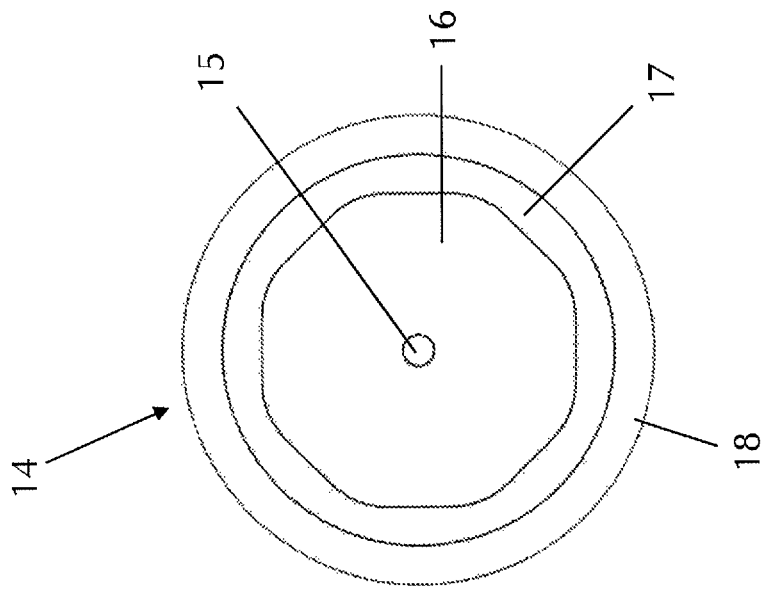
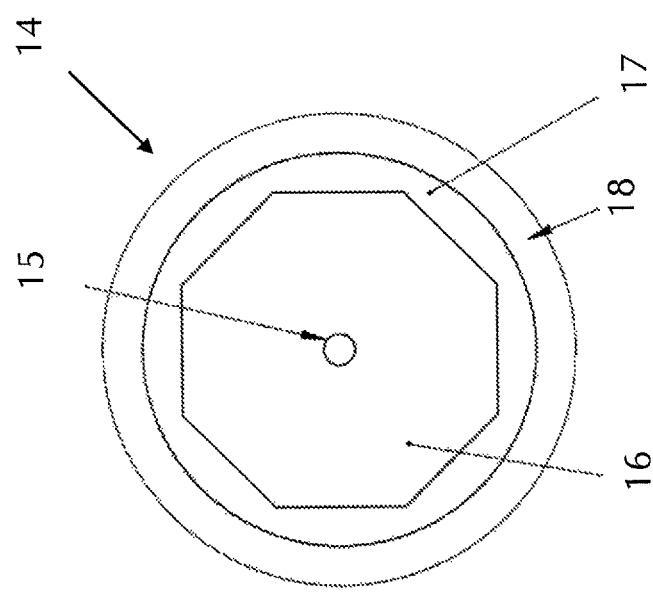

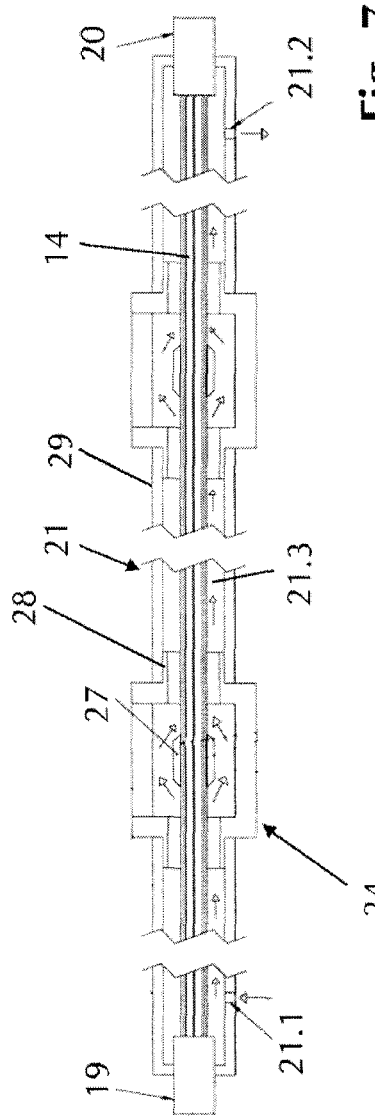
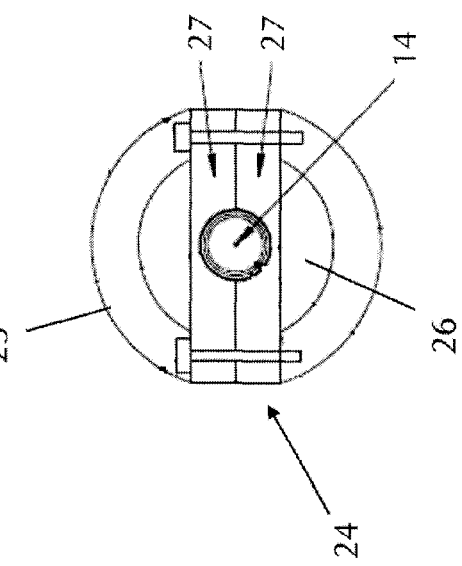
Fig. 7
Fig. 8

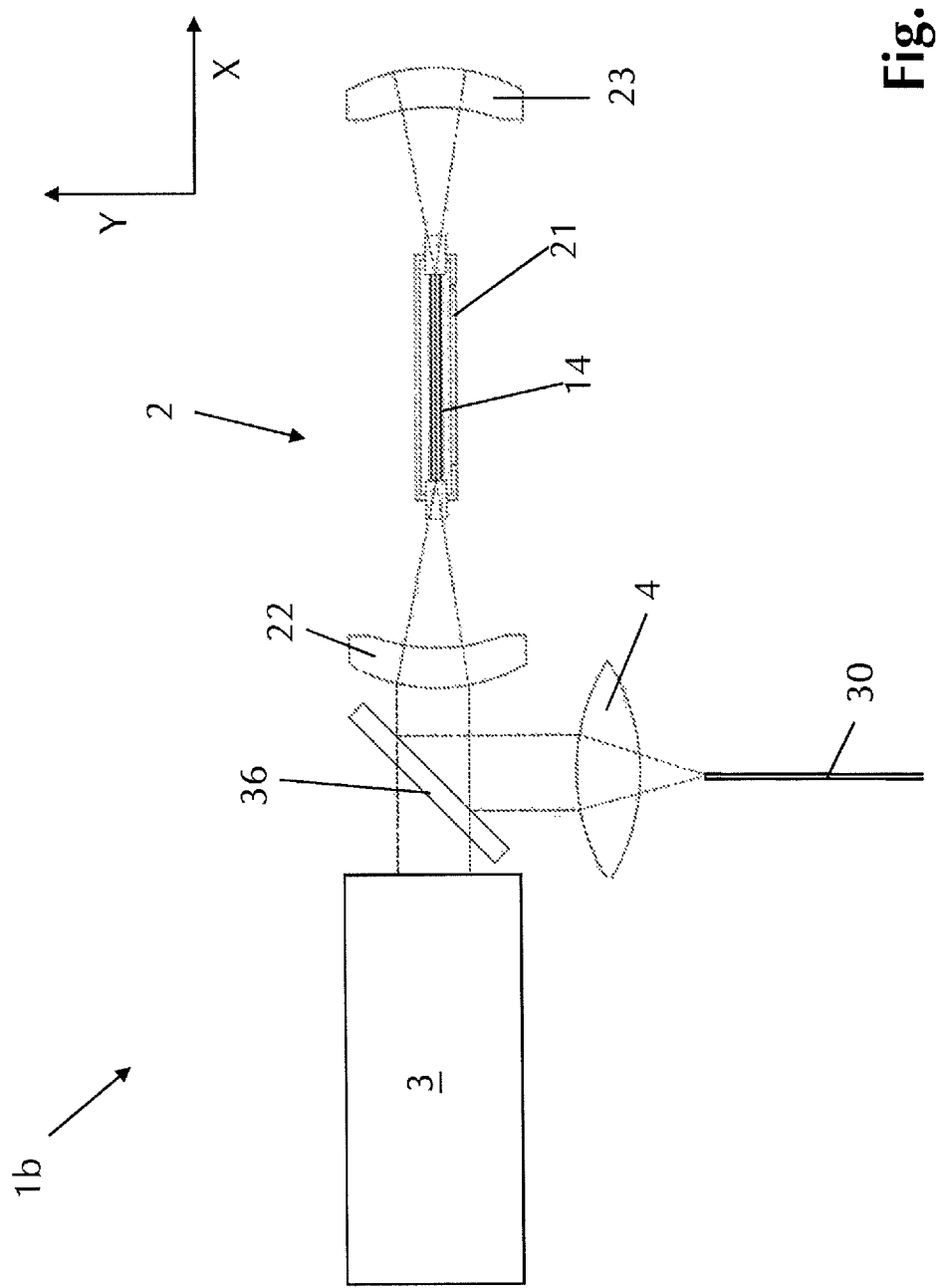

LASER ARRANGEMENT

BACKGROUND OF THE INVENTION

The present invention relates to a laser arrangement with a converter constituted as a fiber laser for generating converted laser output radiation and with a pumping source which delivers pumping radiation for the converter. The laser arrangement comprises a plurality of laser diodes generating the pumping radiation, wherein the pumping source comprises beam-forming optics for forming the laser beams delivered from the emitters into the pumping radiation, and wherein the converted output radiation of the converter is fed via a flexible light guide to a working and/or treatment head delivering output or treatment radiation.

Laser arrangements are known in principle, wherein an active fiber doped with at least one rare-earth element, i.e. doped with a laser-active material, is excited with pumping radiation, so that laser radiation with a radiation emission at one fiber end is forced in this doped active fiber between two optical elements provided at the fiber ends and acting as resonator mirrors. It is also known to surround the active fiber with densely doped cladding of a light-conducting material, i.e. glass or quartz glass, which then forms a pump cladding, which is acted upon by the pumping radiation and via which the radiation is stimulated in the active fiber or in the doped core of the converter fiber formed by the active fiber and the pump cladding. It is also known to cool the fiber ends, i.e. the connections or couplings of converter fibers, with a liquid cooling medium (U.S. Pat. No. 4,732, 450) or to cool the converter fiber with a cooling medium flowing along this—fiber (RU 2031 420).

Finally, diode laser arrangements are known (DE 10 2011 016 253) which generally comprise a source emitting laser light in the form of at least one laser diode stack comprising a plurality laser bars each provided on a cooler, said laser bars each comprising a plurality of emitters emitting laser light and following one another in a slow axis, as well as beam-forming optics comprising a plate spreader.

The problem of the invention is to specify a laser arrangement which provides laser radiation of high quality.

SUMMARY OF THE INVENTION

The laser arrangement according to the invention can be implemented for a power range of converted laser radiation from a few kW up to powers greater than 10 kW. Furthermore, the laser arrangement according to the invention can be used for various areas, i.e. in medicine for example, but also in the processing and/or working of workpieces, for example for the high-quality cutting of workpieces and/or sheet metals, for the heating of workpieces, for example for hardening etc. The diode laser arrangement serving as a pumping source is constituted for example such that the wavelength of the pumping laser radiation lies in the range between 900 nm and 1050 nm, the wavelength of the converted laser radiation emitted by the diode laser or by its converter then being higher, for example in the range between 1050 nm and 1100 nm.

In a preferred embodiment, the pump cladding of the converter fiber is surrounded by at least one further cladding, for example made of moisture-proof and/or water-proof plastic, this cladding then being enclosed, in a particularly advantageous embodiment, by a further external cladding made of a corrosion-resistant metallic material. The effect of the further cladding surrounding the pump cladding is, amongst other things that the pumping radiation remains inside the pump cladding due to total reflection and the latter thus acts intensively on the inner active fiber.

Furthermore, the converter fiber is preferably accommodated in a tubular and/or sleeve-like sheathing, through which a cooling medium, preferably a liquid cooling medium, flows. The couplings and decouplings for the laser radiation into and out of the converter fiber or corresponding light-permeable material, preferably connections or end caps produced from glass or quartz glass, preferably also each extend at least with a partial region into the interior of the cooling housing and are thus also cooled by the cooling medium.

"Active layer" of the laser bar is the layer in which the emitters of the laser bar are disposed and the plane whereof is orientated normal to the fast axis in which the laser beams of the emitters have the greater divergence.

The expression "essentially" or "approximately" means, in the sense that the invention, deviations from the given precise value of +/−10%, preferably of +/−5% and/or deviations in the form of changes unimportant for the function.

Developments, advantages and possible applications of the invention also emerge from the following description of examples of embodiment and from the figures. All the described and/or diagrammatically represented features in themselves alone or in any combination are in principle the subject-matter of the invention.

BRIEF DESCRIPTION OF THE DRAWINGS

The invention is explained in greater detail below with the aid of the figures using examples of embodiment.

In the figures:

FIG. 4 shows, in a simplified representation, the embodiment of the laser beams of two laser bars before the conversion, after the spreading and after the recombination;

FIG. 5, 6 show cross-sections of the converter fiber in different embodiments;

FIG. 7 shows, in an enlarged diagrammatic representation and in cross-section, the cooled converter fiber of the laser arrangement of FIG. 1;

FIG. 8 shows a cross-section corresponding to line I-I of FIG. 6;

FIG. 11 shows, in a partial representation, a laser arrangement according to the invention.

DETAILED DESCRIPTION OF THE INVENTION

Figure 1:
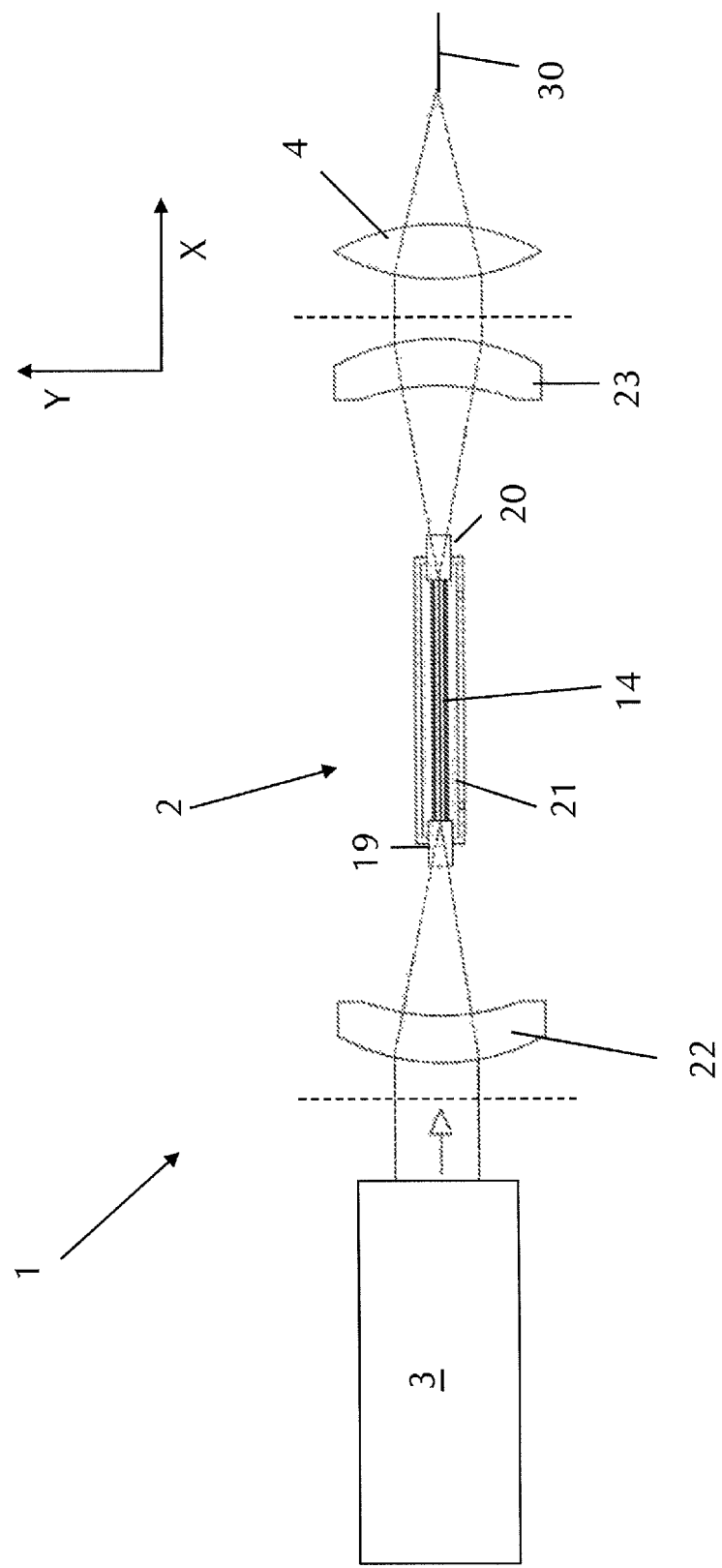
FIG. 1 shows, in a simplified representation, a laser arrangement with an actively cooled converter fiber according to the invention.
Figure 2:
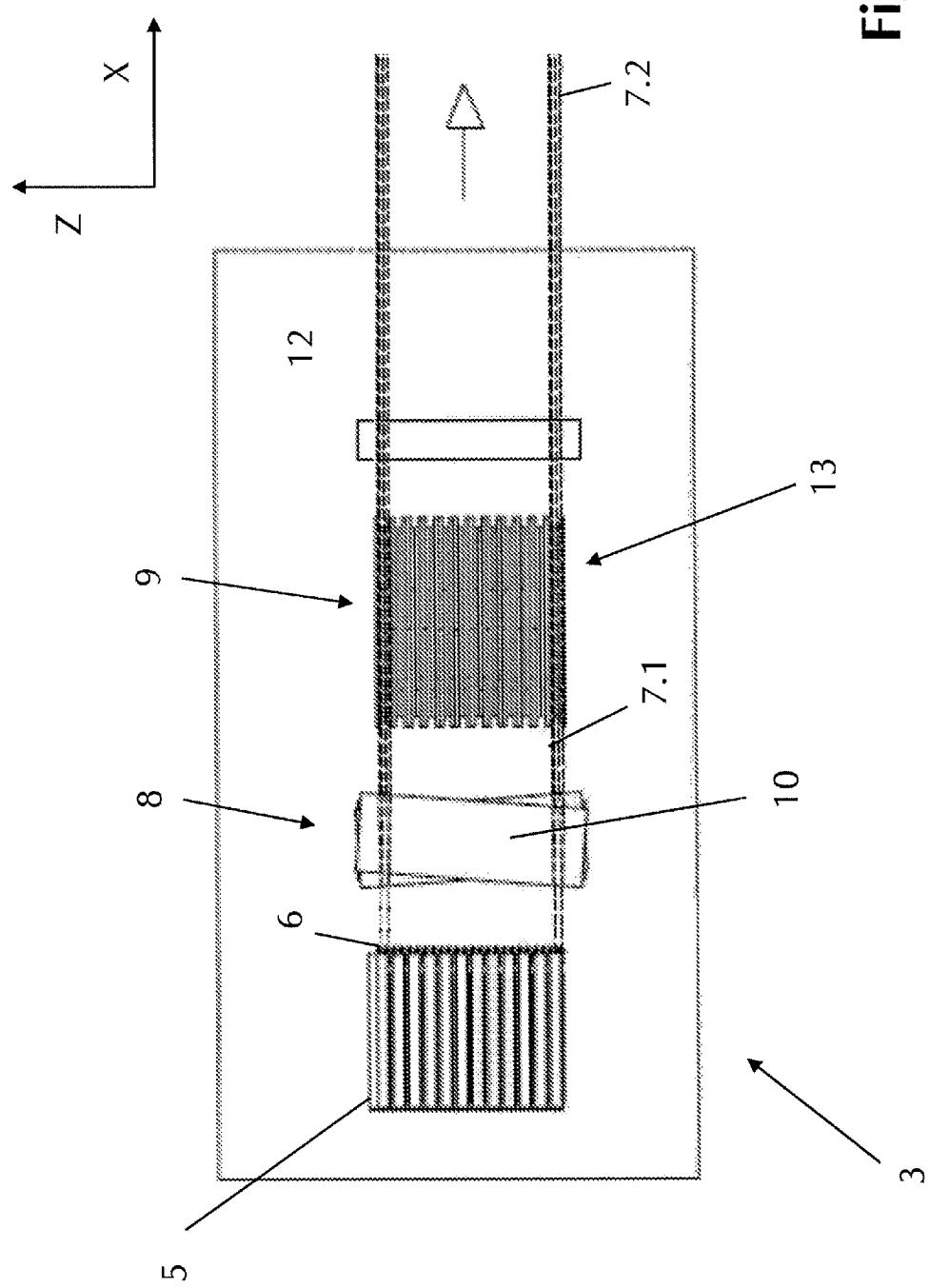
FIG. 2, 3 show, in a diagrammatic representation, a pumping source of the laser arrangement of FIG. 1 constituted by a diode laser arrangement.

For a simpler understanding, three spatial axes orientated normal to one another are each denoted by X, Y and Z in FIGS. 2 and 3. The laser arrangement according to the invention generally denoted by 1 in FIGS. 1-9 essentially comprises a converter 2 in the form of a fiber laser, a diode laser arrangement 3 serving as a pumping source for converter 2 and focusing optics for the converted laser radiation decoupled from converter 2. In the embodiment represented, the aforementioned components have the structure described below:

Diode Laser Arrangement 3

In the represented embodiment, diode laser arrangement 3 comprises two parallel laser diode stacks 5, which are mutually offset in the direction of the Y axis and which each comprise a plurality of laser bars 6 disposed upon one another in a stacked manner in the direction of the Z axis, which laser bars are each provided with a cooling body and comprise a plurality of emitters emitting laser light. The latter are provided following one another on the given laser bar 6 in the direction of their slow axis (Y axis) and therefore normal to the stack axis or Z axis and emit the laser light in the direction of the X axis, which is orientated normal to the slow axis and fast axis of the emitters and, in the represented embodiment, is the optical axis of diode laser arrangement 3. Furthermore, the arrangement is made such that each laser bar 6 of a stack 5 lies at the same level as laser bar 6 of the other stack 5.

Located in the beam path of the laser radiation emitted by laser bars 6 in the form of a beam bundle of single beams 7 is a fast axis collimator (not represented in FIGS. 2 and 3), which is constituted for example by a cylindrical lens lying with its axis in the Y axis and which brings about a collimation of laser beams or single beams 7 in the fast axis, i.e. in the Z axis normal to the active layer of laser bars 6, in which (fast axis) the radiation of the emitters of each laser bar 6 has the greatest divergence. Following the fast axis collimator, the laser radiation essentially exists as a narrow-band beam bundle of single beams 7, as is represented in FIG. 4 in the position a). The fast axis collimator is followed in the beam path by an optical device 8, which is constituted as a plate spreader and serves for the further formation of the laser beam bundle, and more precisely in such a way that the laser beam bundle is first split or spread into beams 7.1 in different planes parallel to the XY plane, wherein beams 7.1 are also mutually offset in the Y axis from plane to plane, as is represented in FIG. 4 in position b). In a further optical device 9 also constituted as a plate spreader, single beams 7.1 of a plurality of laser bars 6 are then pushed on top of one another diagonally in the manner represented in FIG. 4 in position c), so that a beam bundle 7.2 results. Laser beams 7, 7.1 and 7.2 from two laser bars 6 of a stack 5 are reproduced in FIG. 4. To allow a better distinction to be made, the laser beams of one laser bar 6 are shaded and those of the other laser bar 6 are not shaded.

In detail, optical arrangement 8 comprises two parallel plate spreaders 8.1, which are constituted basically identically in the represented embodiment and each comprise a plurality of thin plates 10. The latter are produced from a light-conducting material, for example of glass (optical glass) or quartz glass and have for example a square format. Each plate disposed with its surface sides in the XZ plane has two mutually opposite narrow plate sides for the entry and exit of the laser beams. These end faces are inclined differently from plate to plate with respect to the optical axis or X axis, so that a fan-like structure results and the spreading of single beams 7 into single beams 7.1 in the direction of the Z axis results.

Optical device 9 also comprises a plurality of plates 11 of the light-conducting material or glass or quartz glass following one another in the form of a stack. Plates 11 are disposed with their surface sides in the XY plane and again each comprise, in the beam path of the laser beams, two parallel plane end faces for the entry and exit of the laser beams. These end faces are inclined differently from plate to plate with respect to the optical axis (X axis), so that a fan-like structure results and the pushing of single beams 7.1 on top of one another to form beam bundle 7.2 results, as is represented in FIG. 4 in position c).

Provided following optical device 9 is a slow axis collimator 12, which corrects the divergence that the laser beams exhibit in the slow axis (Y axis) and, in the represented embodiment, is constituted by a cylindrical lens, which is curved only about an axis parallel to the Y axis.

The fast axis collimator (not represented), optical devices 8 and 9 and slow axis collimator 12 constitute, in the represented embodiment, beam-forming optics 13 of diode laser arrangement 3.

Converter 2

Converter 2 constituted as a fiber laser comprises, amongst other things, a converter fiber 14, which in the represented embodiment is multilayered, i.e. with an inner active fiber 15 (active core) made of a light-conducting material, preferably of glass or quartz glass. Fiber 15 is doped at least with a laser-active medium or substance, for example with erbium and/or ytterbium and/or neodym, and is surrounded by cladding 16 made of a light-conducting material, preferably of glass or quartz glass, which forms the pump cladding (pump clad) of converter fiber 14 and is made of undoped light-conducting material, preferably glass or quartz glass. Cladding 16 is surrounded by further cladding 17 made of a suitable plastic, for example water-proof plastic. Outer cladding 18, for example made of a corrosion-resistant metallic material, serves as the outer termination of converter fiber 14.

This structure of converter fiber 14 is represented in FIGS. 5 and 6. As can also be seen in these figures, cladding 16 serving as the pump cladding has a cross-section diverging from the circle shape, in order in this way to optimise the coupling of the laser or pump radiation delivered by pumping source or diode laser 3 into inner active fiber 15. In FIG. 5, cladding 16 has an octagonal cross-section with pronounced corners and, in FIG. 6, an octagonal cross-section with rounded corners. Inner fiber 15 has for example a diameter in the range between 10 μm and 20 μm and cladding 16 has a diameter of approx. 400 μm to 200 μm. Other cross-sections of converter fiber 14 suitable for this are possible, for example an eccentric arrangement of active fiber 15 in the cladding 16 which, in this case too, then preferably has a cross-section diverging from the circle shape.

At its two ends, converter fiber 14 is provided in each case with an optical connection enabling the entry and exit of laser radiation into converter fiber 14 or out of this fiber, said optical connection being in the form of an end cap 19 and 20 made of light-conducting material, preferably of glass or quartz glass. Furthermore, converter fiber 14 is accommodated in the interior 21.3 of a sheathing 21 which extends over the entire length of this fiber and through which a cooling medium, for example a liquid cooling medium or cooling water, can flow, at the ends of which sheathing end caps 19 and 20 are also provided, which each extend, for the purpose of their cooling, with a partial length into sheathing 21 or into its interior 21.3. In the represented embodiment, sheathing 21 is constituted tubular or sleeve-like, and more precisely with a cooling medium inlet 21.1 in the region of end cap 19 acted upon, amongst other things, by the laser radiation from diode laser 3, and with a cooling medium outlet 21.2 in the region of end cap 20, which also serves, amongst other things, for conducting out the laser radiation converted by converter 2. The two end caps 19 and 20 are coated with an antireflection layer for the pumping radiation and the converted laser radiation and are also connected to active fiber 15, for example by means of a splice connection. Furthermore, end caps 19 and 20 have for example a length of 10 mm to 40 mm and a diameter in the range between approx. 5 mm and 20 mm.

Furthermore, converter 2 comprises two resonator mirrors 22 and 23, whereof resonator mirror 22 lies, amongst other things, in the beam path of the laser radiation delivered by diode laser arrangement 3 and brings about focusing of this radiation onto end cap 19 or onto converter fiber 14 and, for this purpose, is curved in the manner of a convex lens at its side facing away from end cap 19. At the side facing end cap 19, resonator mirror 22 is curved convex in the manner of a concave mirror for its resonator mirror function. Furthermore, resonator mirror 22 is constituted such that, at its coupling side facing away from end cap 19, it has no or essentially no reflection properties, i.e. is constituted as an antireflection mirror for the pumping radiation, and, at its side facing end cap 19, has a high reflection, i.e. is constituted as a high-reflection mirror for the radiation exiting from converter fiber 14. Resonator mirrors 22 and 23 are preferably constituted adjustable.

A further resonator mirror 23 is provided in the beam path following end cap 20. In order to generate parallel or essentially parallel output laser radiation, this resonator mirror 23 is again convex or in the manner of a convex lens at its side facing away from end cap 20 and concave or in the manner of a concave mirror at its side facing end cap 20. Furthermore, resonator mirror 23 is constituted such that it acts at its concave side as a high-reflection mirror for the pumping radiation and as an antireflection mirror for the converted output radiation of the converter, i.e. enables a passage of the converted output radiation or laser radiation without reflection or essentially without reflection.

FIGS. 7 and 8 show, again in an enlarged representation, converter fiber 14 with sheathing 21 and with annular cooling channel 21.3 formed by said sheathing and surrounding converter fiber 14 over its entire circumference. In order to ensure that converter fiber 14 is always spaced apart from the inner surface of sheathing 21 over its entire length and that cooling channel 21.3 is thus constituted in the optimum manner over the entire length of converter fiber 14, converter fiber 14 is repeatedly held by, in each case, one support element 24. The latter essentially comprises a housing 25, which forms a housing interior 26 which is closed to the exterior and in which converter fiber 14 passed through housing interior 26 is held between an upper and a lower fiber holder 27. Provided at two sides of housing 25 lying opposite one another is, in each case, a flange-like connection 28 through which converter fiber 14 is passed and which is used for the connection of a hose piece or tube piece 29, which is part of sheathing 21. In the represented embodiment, therefore, the latter comprises holding elements 24 and hose or tube pieces 29.

Figure 9:
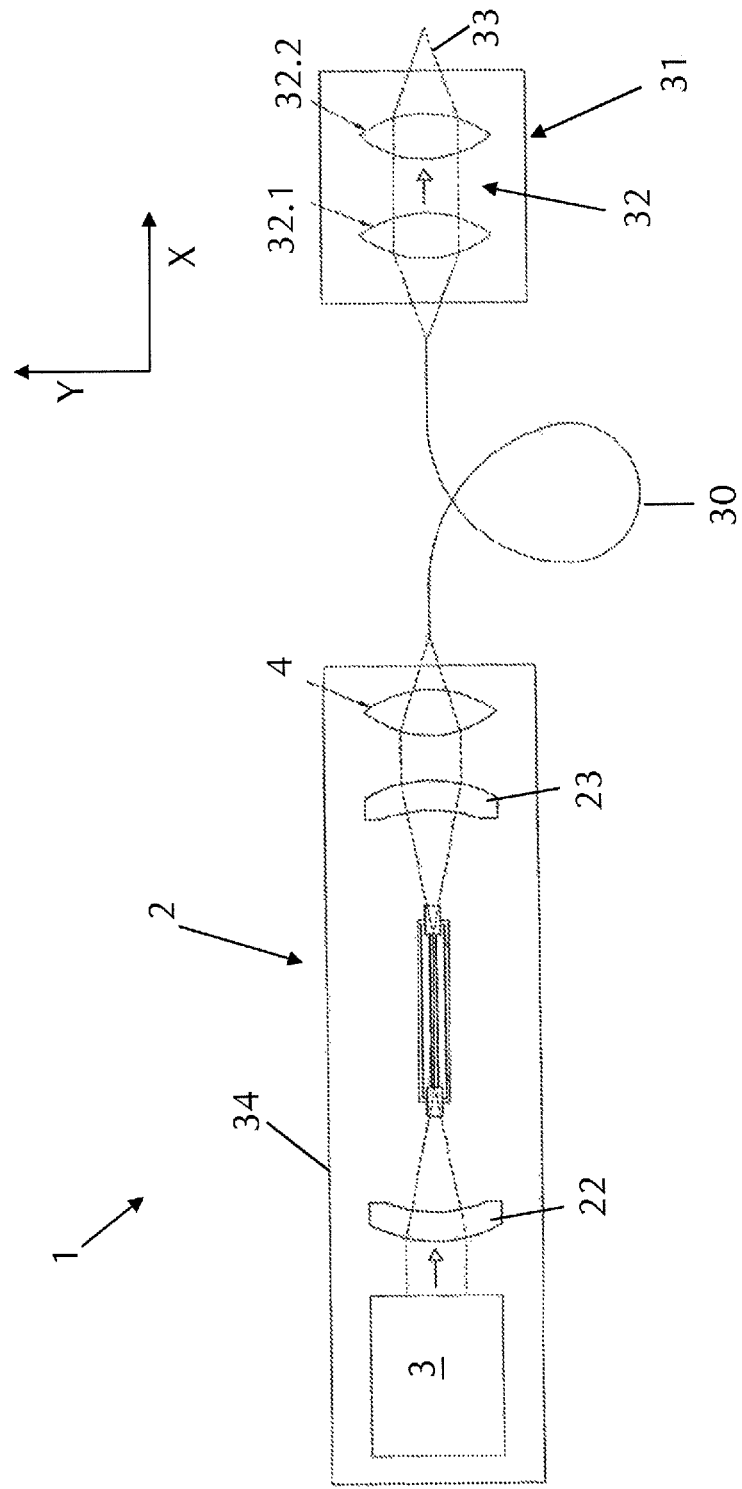
FIG. 9 shows, in a representation as in FIG. 1, a laser arrangement according to the invention with the pumping source and the converter as well as a treatment or working head and a flexible light guide in the form of a light guide cable for the transmission of the converted laser radiation to the treatment or working head.

In laser arrangement 1, as FIG. 9 shows, the converted laser radiation focused by focusing optics 4 is coupled into a light guide cable 30 and transmitted via this cable to a treatment or working head 31, in which the laser radiation is converted by beam-forming optics 32 into an output and/or treatment beam 33 focused at a treatment point or focus. Beam-forming optics 32 comprises for example a collimation lens 32.1 and a focusing lens 32.2 following the latter in the beam path. During the treatment or for the treatment for example, treatment head 31 is moved and/or adjusted in space, e.g. with a manipulator, and more precisely for example in three spatial axes orientated normal to one another, whereas the pumping source constituted by diode laser arrangement 3 and also converter or fiber laser 2 and focusing optics 4 are stationary during the treatment, i.e. form a stationary unit 34 during the treatment. Treatment head 31 can however also be disposed stationary during the treatment.

Figure 10:
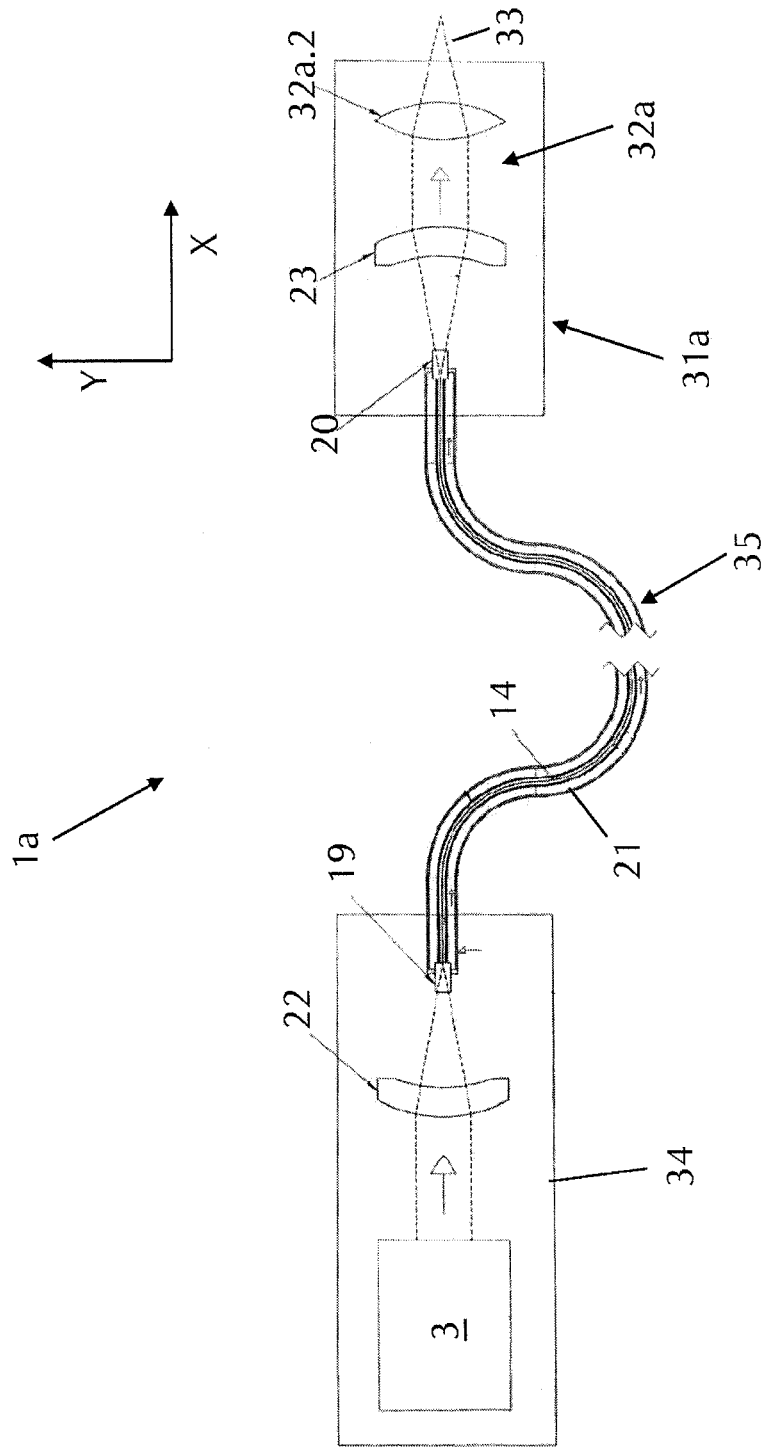
FIG. 10 shows a representation similar to FIG. 9, wherein the light guide is constituted by the converter fiber, in a further embodiment.

FIG. 10 shows a further embodiment of a laser arrangement 1*a*, which differs from laser arrangement 1 in that converter fiber 14 accommodated in sheathing 21 reaches up to treatment head 31*a*, which for example can again be moved and/or adjusted in space during the treatment or for the treatment. In this embodiment, therefore, converter fiber 14 accommodated in sheathing 21 forms the connection or the light guide between unit 34 of laser arrangement 1*a* stationary during the treatment and treatment head 31*a*. Furthermore, the converter fiber and sheathing 21 form a flexible converter fiber/cooling hose combination 35. In this embodiment, the pumping source constituted by diode laser arrangement 3, optical element 22 and the end of converter fiber/cooling hose combination 35 comprising end cap 19 are provided in stationary unit 34. Optical element 23 and the end of converter fiber/cooling hose combination 35 constituting end cap 20 are provided in treatment head 31*a*. Optical element 23 is part of beam-forming optics 32*a* of treatment head 31*a*, which in the represented example of embodiment comprises, in addition to optical element 23 and following the latter in the beam path, focusing lens 32*a*.2 corresponding to focusing lens 32.2, and more precisely for forming focused output and/or treatment beam 33. Treatment head 31*a* can also be disposed stationary during the treatment.

FIG. 11 shows a further embodiment of a laser arrangement 1*b*, which differs from laser arrangement 1 in that the converted laser radiation is decoupled into light guide cable 30 not at resonator mirror 23, but rather between pumping source or diode laser arrangement 3 and resonator mirror 22, i.e. at this resonator mirror, and more precisely by a dichroitic mirror 36, which is inclined with respect to the axial direction of the pumping radiation of diode laser arrangement 3, i.e. with respect to the X axis, and the surface sides whereof form with the Y-Z plane an angle less than 90°, for example an angle of 45° or essentially of 45°. Mirror 36 separates the laser radiation of diode laser arrangement 3 from the converted laser radiation of converter fiber 14. Possible combinations of the properties of mirror 36 are:

Mirror 30 is permeable for the pumping radiation, but highly reflecting for the converted radiation, or Mirror 30 is highly reflecting for the pumping radiation, but permeable for the converted radiation.

Irrespective of the given embodiment, the wavelength of the laser radiation delivered by diode laser arrangement 3 lies for example in the range between 900 nm and 1500 nm. The wavelength of the converted laser radiation lies above the wavelength of the pumping radiation, for example at 1500 nm to 1100 nm. The pumping radiation delivered by diode laser arrangement 3 lies for example in a power range from several kW up to powers greater than 10 kW. For this reason, too, optimum cooling of converter fiber 14 is required to carry away power losses, which arise amongst other things during the coupling of the pumping radiation into inner fiber 15.

To increase the pumping power and therefore also the output power and/or the power density, it is expedient to operate diode laser arrangement 3 in such a way that the pumping radiation comprises wavelength multiplexing of a plurality of wavelengths from a wavelength range of the pumping radiation, for example from the wavelength range between 900 nm and 1060 mm.

The invention has been described above using examples of embodiment. It goes without saying that numerous changes and modifications are possible, without thereby departing from the inventive idea underlying the invention.

LIST OF REFERENCE NUMBERS 1, 1a, 1b laser arrangement
2 converter
3 diode laser arrangement (pumping source)
4 focusing optics
5 stack
6 laser bars
7, 7.1 7.2 single beams
8, 9 optical element
8.1 plate spreader
10, 11 plates
12 slow axis collimator
13 beam-forming optics
14 converter fiber
15 inner active fiber or active core
16-18 cladding
19, 20 end cap
21 sheathing
21.1, 21.2 connection
21.3 cooling channel
22, 23 resonator mirror
24 holding device
25 housing
26 housing interior
27 fiber holder
28 connection
29 tube piece or hose piece
30 light guide cable
31, 31a treatment head
32, 32a beam-forming optics
32.1 collimator lens
32.2, 32a.2 focusing lens
33 focused output and/or treatment beam
34 stationary part
35 converter fiber/cooling hose combination
35 mirror
X, Y, Z spatial axes

The invention claimed is:

1. A laser arrangement having a converter for generating converted laser output radiation and having a pumping source which delivers pumping radiation for the converter and comprising:
a plurality of laser diodes generating the pumping radiation, wherein the pumping source comprises beam-forming optics for forming laser beams delivered from emitters into the pumping radiation, wherein a converted output radiation of the converter is fed via a flexible light guide to a working treatment head delivering the converted output radiation, wherein a flexible light guide is a converter fiber of the converter, wherein the converter fiber is accommodated in an interior of a sleeve-like sheathing through which a cooling medium can flow, and
beam-forming optics including an optical element acting as a collimator lens for the formation of a parallel or essentially parallel beam and, following the beam forming optics with the optical element in a beam path,
a second optical element provided in the treatment head acts as a focusing lens for forming a focused output and/or processing beam,
wherein a first optical device and a second optical device are each constituted by at least one plate spreader with a plurality of plates following one another at their surface sides, the plates of the first optical device are orientated with their surface sides normal to a first axis (Y axis) and the plates of the second optical device are orientated with their surface sides normal to a third axis (Z axis).

2. The laser arrangement according to claim 1, wherein the plurality of laser diodes of the pumping source are each constituted by emitters on at least two laser bars, whereby the emitters of the at least two laser bars are provided following one another in a direction of a first axis (Y axis) corresponding to a slow axis of the emitters of the at least two laser bars, and the emitters of the at least two laser bars are disposed with their active layers each in a plane (XY plane) which includes the first axis (Y axis) and a second axis (X axis) normal thereto, are disposed on top of one another in a diode laser stack in a third axis (Z axis) which corresponds to a fast axis and which is orientated normal to the first and second axis, and wherein beam-forming optics comprises in a beam path following the diode laser stack, a first optical device for spreading the laser beams delivered by the emitters of each of the at least two laser bars in the third axis and, following the first optical device, a second optical device, with which spreaded optical beams of all the at least two laser bars are recombined by being pushed on top of one another in the direction of the first axis (Y axis) to form a laser beam bundle.

3. The laser arrangement according to claim 1, wherein the sleeve-like sheathing is a flexible sleeve.

4. The laser arrangement according to claim 1, wherein when the converted laser beam is decoupled into a light guide, a mirror is disposed at a side of the converter facing the pumping source in the beam path of the pumping radiation, the mirror separates the radiation from the pumping source at the converter, from radiation in the reverse direction.

5. The laser arrangement according claim 1, wherein the treatment head can be moved and/or adjusted.

6. The laser arrangement according to claim 1, wherein at least two parallel diode laser stacks mutually offset in the direction of the first axis (Y axis) are provided, that the laser bars of a diode laser stack are orientated with their active layers parallel to the active layers of the laser bars of the other stack.

7. The laser arrangement according to claim 1, wherein the converter comprises at least an inner fiber doped with a laser-active additive and is made of a light-conducting material, as well as an undoped pump cladding surrounding the inner fiber and the cladding is made of a light-conducting material and that a connection for coupling and/or decoupling the pumping radiation and the converted radiation is provided at both ends of the converter fiber whereby a connection made of a light-conducting material.

8. The laser arrangement according claim 7, wherein an optical element acting as a resonator mirror is provided in ends of the converter fiber, and the optical element acting as a resonator mirror acts as an antireflection mirror for the laser or pumping radiation coupled by the pumping source into the converter fiber and acts as a mirror with high reflection for the radiation coming from the converter fiber, whereby the optical element acting as a resonator mirror is disposed in the beam path between the pumping source and the converter fiber and through which the pumping radiation of the pumping source passes.

9. The laser arrangement according to claim 8, wherein when the converted radiation is decoupled at a second optical element acting as a resonator mirror, this second optical element acts as a high reflection mirror for the pumping radiation and as an antireflection mirror for the converted radiation decoupled from the converter fiber.

10. The laser arrangement according to claim 8, wherein the optical element is a concave-convex resonator mirror, the mirror is concave in the manner of a concave mirror at a side facing the ends of the converter fiber and convex in the manner of a convergent lens at a side facing away from the converter fiber.

11. The laser arrangement according to claim 8, wherein the optical element is made of a light-permeable material and reflection properties are achieved by material properties and/or a surface coating.

12. The laser arrangement according to claim 1, wherein a wavelength of the pumping radiation lies in a range between 900 nm and 1050 nm and/or a wavelength of the converted radiation lies in a range between 1050 nm and 1100 nm, and/or the inner active fiber has a diameter in the range between 10 µm and 200 µm and/or a pump cladding has a diameter in a range between 400 µm and 2000 µm.

\* \* \* \* \*